May 12, 1959 S. C. ROGERS 2,886,706

BLOCKING OSCILLATOR PULSE WIDTH CONTROL

Filed Dec. 13, 1955

INVENTOR
S. C. ROGERS
BY N. L. Keefauver
ATTORNEY

United States Patent Office 2,886,706

Patented May 12, 1959

2,886,706

BLOCKING OSCILLATOR PULSE WIDTH CONTROL

Samuel C. Rogers, Morristown, N.J., assignor to Bell Telephone Laboratories, Incorporated, New York, N.Y., a corporation of New York Application December 13, 1955, Serial No. 552,762

6 Claims. (Cl. 250—36)

This invention relates to transistor blocking oscillator circuits and more particularly to controlling the width of the output pulses produced by such circuits.

A significant problem in the transistor blocking oscillator art is that of regulating the length of output pulses accurately and consistently. Transistor blocking oscillator circuits are subject to pulse width variations caused by the use of different transistors in the circuit and by changes in temperature. For example, at room temperature, the output of a 70 microsecond blocking oscillator may vary plus or minus 10 microseconds with different transistors in the same circuit.

In certain transistor blocking oscillators regeneration is halted by the saturation of a ferrite core transformer. A change in temperature of 100° C. can cause the output pulse width of such an oscillator to change plus or minus 20 percent.

It is therefore one object of this invention to control blocking oscillator output pulse width.

Another object of the invention is to render blocking oscillator output pulse duration independent of variations in ambient temperature and in the characteristics of different transistors.

These and other objects are accomplished in one embodiment of the invention by providing a conventional transistor blocking oscillator with a degenerative feedback path coupling the transistor collector electrode to the emitter electrode, which path includes a timing waveform generator and amplitude selecting means. The oscillator is also provided with regenerative feedback via a coupling between the transistor base and collector electrodes. The The timing waveform generator can be a slope circuit such as that described in the copending application of C. D. Klapp, Serial No. 501,612, filed October 13, 1954, now Patent No. 2,849,626, issued August 26, 1958, or that described in vol. 19 of the M.I.T. Radiation Laboratory Series, "Waveforms," on page 261. The waveform generator is triggered by the leading edge of the oscillator output pulse, and upon the attainment of a predetermined potential level, the degenerative feedback path becomes conductive and the waveform generator voltage turns off the oscillator.

One feature of this invention is that pulse timing is dependent upon the timing of slope circuit potential rise with respect to transistor base potential. The slope circuit timing can vary with temperature, but the slope circuit can be easily temperature compensated without appreciably affecting the blocking oscillator output voltage wave shape. The transistor base electrode potential is primarily a function of the feedback transformer turns ratio, rather than core saturation; and the transformer turns ratio is relatively independent of temperature variations.

Figure 1:
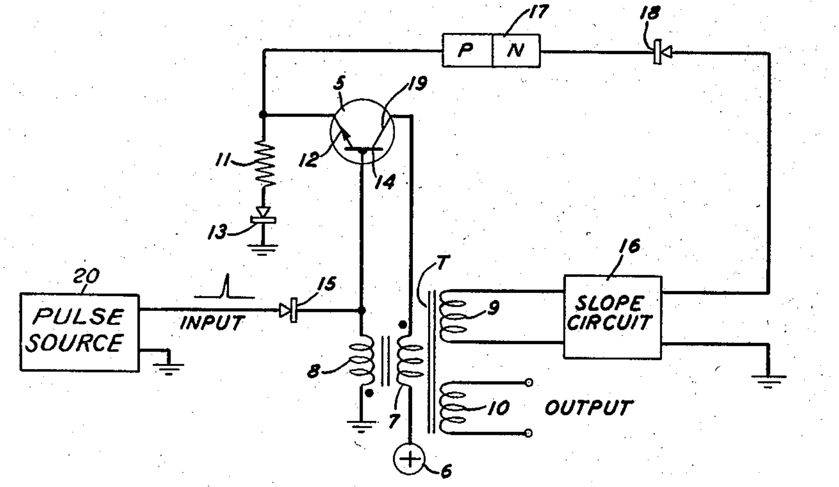
Figure 2:
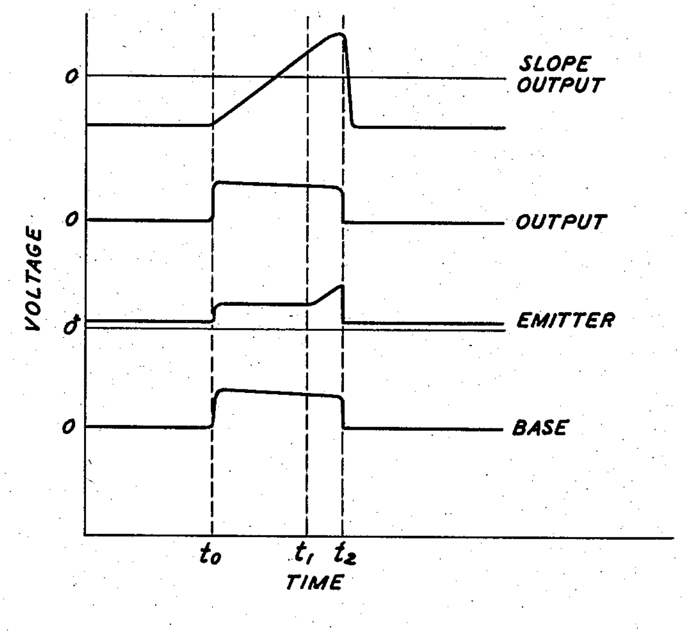

The objects and advantages of the invention will be more clearly understood from a consideration of the following specification in connection with the attached drawing in which:

Fig. 1 is a schematic circuit diagram of a blocking oscillator provided with a degenerative feedback circuit in accordance with this invention; and Fig. 2 is a series of illustrative voltage waveshapes at different points in the oscillator circuit.

In Fig. 1 there is shown a conventional transistor blocking oscillator modified in accordance with the principles of the invention. The basic oscillator comprises an n-p-n junction transistor 5 having an emitter 12, a base 14, and a collector 19 and primary winding 7 and secondary winding 8 of a transformer T coupling collector 19 to base 14. Transistor 5 is connected in a common base-circuit configuration which includes an input circuit connected to emitter 12 and base 14 and an output circuit coupled via secondary winding 10 of the transformer to primary winding 7 thereof and thereby is coupled to collector 19 and base 14, as described hereinafter in greater detail. The source 6 of operating potential is connected to collector 19 through primary winding 7 of the transformer. One end of the secondary winding 8 is returned to ground. The natural period of oscillation of the basic oscillator under all conditions is greater than that desired and is determined by the time required for the core of the transformer T to become saturated.

A resistor 11 and a diode 13 are connected in series between emitter electrode 12 and ground. The resistor 11 provides the potential drop during the oscillator cycle to cut off oscillation as hereinafter described in greater detail. The diode 13 is poled for forward conduction from emitter 12 toward ground. Diode 13 is of a type, such as silicon, which provides a high impedance to forward currents which are below a certain level and a much lower impedance to forward currents above that level. Thus, in its high forward impedance state diode 13 comprises nearly the total impedance from emitter 12 to ground. When diode 13 is in its low forward impedance state, however, resistor 11 comprises substantially all of the impedance from emitter 12 to ground. When transistor 5 is in the quiescent condition, leakage current from emitter 12 flows through diode 13 and provides a slight positive bias on emitter 12. This prevents false triggering of the oscillator by noise voltages.

The input circuit for transistor 5 thus includes resistor 11, diode 13, ground, and secondary winding 8. The output circuit for transistor 5 comprises primary winding 7, source 6, ground, and secondary winding 8. Input signals in the form of positive trigger pulses are applied to base electrode 14 from pulse source 20 via an isolating diode 15 poled in the direction of base electrode 14. Oscillator ouput is obtained across the terminals of secondary winding 10 of transformer T.

The above-described portion of the oscillator illustrated in Fig. 1 is conventional. In accordance with the invention there is added to the basic oscillator circuit just described a degenerative feedback path comprising primary winding 7 and secondary winding 9 coupling collector 19 to emitter 12 and including slope circuit 16. Slope circuit 16 is triggered by the oscillator output through secondary winding 9. Emitter 12 is connected to the output of slope circuit 16 by means of a breakdown diode 17, such as that shown in the United States Patent 2,714,702, issued August 2, 1955, to W. Shockley, which is poled for forward conduction away from emitter 12, and a rectifier 18 which is poled for forward conduction toward emitter 12. Briefly, a breakdown diode, such as diode 17, displays a reverse breakdown characteristic which is much sharper than the forward breakdown characteristic when it is subjected to a reverse bias voltage greater than a predetermined magnitude. Rectifier 18 prevents current flow from emitter 12, through breakdown diode 17 in the forward direction, and through the slope circuit 16 to the ground connected thereto when the slope voltage is negative and emitter current is flowing in resistor 11.

The oscillator therefore has a degenerative feedback path including secondary winding 9, slope circuit 16, breakdown diode 17, and rectifier 18. The oscillator also has a regenerative feedback path from collector electrode 19 to base electrode 14 through the coupling between primary winding 7 and secondary winding 8.

The operation of the circuit of Fig. 1 will be more clearly understood when considered in connection with the illustrative waveforms of Fig. 2 wherein voltage variations are plotted against a time scale. These waveforms are not drawn to scale. A positive trigger pulse applied to base electrode 14, from pulse source 20, at $t_0$ drives base 14 positive with respect to emitter 12 and initiates transistor conduction. Emitter current flowing from emitter 12 to ground via resistor 11 and diode 13 increases the positive potential at emitter 12 which tends to bias breakdown diode 17 in the forward direction, but rectifier 18 blocks forward conduction through diode 17 as mentioned above. Current from source 6 flows through primary winding 7 to collector 19 causing the upper end of winding 7 to go negative with respect to the lower end. The induced voltage in secondary winding 8 drives the upper end of winding 8 positive with respect to the lower end thereof as suggested by the dots adjacent the aforementioned ends of windings 7 and 8. This of course drives base electrode 14 still further positive which tends to draw more current from source 6 through collector 19. The regenerative action continues in this fashion until it can be stopped by the increase in emitter potential to a level greater than the instantaneous base potential by the application of a positive voltage to emitter 12 from slope circuit 16 via diodes 17 and 18.

The voltage which appears across winding 7 when transistor 5 is triggered is coupled to secondary windings 9 and 10. The induced voltage in winding 10 is the oscillator output voltage. The induced voltage in winding 9 triggers slope circuit 16 into conduction at time $t_0$. Slope circuit 16 generates a linearly increasing output voltage. In the interval from time $t_0$ to time $t_1$ the slope voltage increases from a negative value to a positive value which corresponds to that value required to overcome the forward bias on breakdown diode 17 and apply sufficient reverse bias thereto to cause current to flow in the feedback path through diode 18, breakdown diode 17, resistor 11 and diode 13 to ground. During the same interval the output voltage and the emitter and base voltages remain substantially constant as shown in Fig. 2.

At $t_1$ diode 17 breaks down in the reverse direction, and degenerative feedback action begins. Slope circuit 16 drives a degenerative feedback current through diodes 17 and 18, resistor 11, and diode 13 to ground. The increased current flowing through resistor 11 increases the potential drop across resistor 11 and causes the voltage at emitter 12 to increase in the same fashion as the upper portion of the output voltage wave of slope circuit 16 as shown in Fig. 2. At time $t_2$ emitter 12 attains a potential which is slightly greater than the then instantaneous potential at base 14 so transistor 5 is no longer able to sustain conduction and is cut off. The resultant sharp decrease in current flowing in primary winding 7 induces a voltage in secondary winding 10 which terminates the output pulse in winding 10 and at the same time induces a voltage in winding 9 which applies a cutoff potential to slope circuit 16. The slope voltage decreases to its original negative value and the oscillator circuit is restored to its quiescent condition.

Thus the oscillator output pulse length is determined completely by the time necessary for the slope voltage from slope circuit 16 to drive the potential at emitter 12 to a value which exceeds the potential of base 14. The time required for slope circuit 16 to generate a particular potential is easily controlled because of the inherent properties of that type of circuit. In addition, temperature compensating resistors, or the like, can be used freely in slope circuit 16 because the rise time of its output wave is long compared to the rise time required for oscillator output pulses. The potential of base electrode 14 is, for practical purposes, under the exclusive control of the ratio between the numbers of turns of wire constituting transformer windings 7 and 8, which ratio is not affected by temperature changes. Thus the oscillator output pulse length is practically under the exclusive control of slope circuit 16 and is independent of variations in other circuit parameters.

Although the invention has been described and illustrated in connection with one embodiment thereof to explain its principles and operation other embodiments and modifications within the spirit and scope of the invention will be readily apparent to those skilled in the art.

What is claimed is:

1. A blocking oscillator having an input circuit and an output circuit, a source of trigger pulses connected to said input circuit for triggering said oscillator into conduction, bias means in said input circuit for normally tending to bias said oscillator into a nonconducting condition in the absence of a pulse from said source, a timing wave generator for producing an output voltage wave of predetermined configuration with respect to time in response to the initiation of conduction in said oscillator, amplitude selection means, and degenerative feedback means including said timing wave generator and said amplitude selection means connected between said output circuit and said input circuit, said bias means tending to bias said amplitude selection means into a nonconducting condition during conduction in said oscilator to block said degenerative feedback path, said output voltage wave of said generator biasing said amplitude selection means into conduction upon the attainment of a first predetermined amplitude, said bias means returning said oscillator to its normally nonconducting condition in response to the attainment by said output voltage wave, of a second predetermined amplitude.

2. A blocking oscillator circuit comprising in combination a transistor having a base electrode, an emitter electrode and a collector electrode, mutual inductance means coupling said collector electrode to said base electrode to establish regenerative feedback therebetween, means for biasing a preselected one of said electrodes to hold said transistor in an inactive condition, a source of trigger pulses connected to a further preselected one of said electrodes to trigger said transistor into active conduction, an output circuit coupled to said collector electrode, means for generating an impulse of predetermined configuration with respect to time in response to the application of a pulse thereto, normally-nonconducting amplitude selection means, and a degenerative feedback path from said collector electrode to said emitter electrode for biasing said transistor into said inactive condition at a predetermined time after it has been triggered into conduction, said degenerative feedback path including said generating means and said amplitude selection means, a predetermined amplitude of said impulse biasing said selection means into conduction.

3. A blocking oscillator comprising a transistor having base, collector, and emitter electrodes, a transformer having a primary winding and a secondary winding, a source of potential, a connection from one terminal of each of said transformer windings to a different terminal of said source, a regenerative feedback path from said collector electrode to said base electrode including said transformer, means for applying triggering pulses to said base electrode, a resistor, a biasing diode, means connecting said resistor and said biasing diode in series between said emitter electrode and said source terminal which is connected to said secondary winding, said diode being poled for forward conduction from said emitter electrode toward said source, said diode having a first forward impedance to currents below a predetermined level and much lower forward impedance to currents above said predetermined level, said resistor having a resistance which is small compared to said diode first forward impedance and large compared to said diode lower forward impedance, a timing wave generator for generating an output wave of predetermined configuration and maximum magnitude in response to an oscillator output pulse in said transformer, a rectifier, a breakdown diode having a sharp breakdown characteristic when it is subjected to reverse bias greater than a predetermined magnitude which is less than said timing wave maximum magnitude, and degenerative feedback means including said rectifier, said breakdown diode, and said timing wave generator for coupling said collector electrode to said emitter electrode, said rectifier being poled for forward conduction from said generator to said emitter electrode, said breakdown diode being poled for reverse conduction from said generator to said emitter electrode.

4. In a blocking oscillator comprising means having conduction and nonconduction states, an input circuit connected to said means, an output circuit coupled to said means, means for normally biasing said means to the nonconduction state, and a source of pulses connected to said input circuit for triggering said first-mentioned means into the conduction state and thereby producing a voltage pulse in said output circuit, degenerative feedback means for rendering the time duration of the voltage pulse in said output circuit independent of variations in ambient temperature and in the characteristics of different ones of said first-mentioned means, said feedback means being connected between said input and output circuits and including a voltage generator and a uni-directional amplitude-selection means poled for forward conduction away from said input circuit, said biasing means also biasing said amplitude-selection means in the forward direction, said generator being normally inoperative and rendered operative in response to the conduction state in said first-mentioned means for producing a voltage of predeterminedly increasing magnitude, said generator voltage of a first predetermined magnitude being effective in said feedback means for reverse-biasing said amplitude-selection means to establish conduction therein in the reverse direction and thereby change said degenerative feedback means to the operative condition, said feedback means in the operative condition supplying a voltage to augment the normal biasing voltage on said first-mentioned means for returning said first-mentioned means to the nonconduction state upon a generator voltage of a second predetermined magnitude being effective in said operative feedback means.

5. The blocking oscillator circuit according to claim 4 in which said amplitude-selection means comprises a breakdown diode having a sharp voltage breakdown characteristic when it is subjected to a reverse bias voltage of the first predetermined magnitude.

6. The blocking oscillator circuit according to claim 4 in which said feedback means includes a rectifier device poled in a direction opposite to the poling of said amplitude-selection means.

References Cited in the file of this patent

UNITED STATES PATENTS

| | | |
|---|---|---|
| 2,616,048 | Rubin | Oct. 28, 1952 |
| 2,671,858 | Fong | Mar. 9, 1954 |
| 2,726,329 | Henderson | Dec. 6, 1955 |